(12) United States Patent
Morohashi et al.

(10) Patent No.: US 11,694,738 B2
(45) Date of Patent: Jul. 4, 2023

(54) APPARATUSES AND METHODS FOR MULTIPLE ROW HAMMER REFRESH ADDRESS SEQUENCES

(71) Applicant: MICRON TECHNOLOGY, INC., Boise, ID (US)

(72) Inventors: Masaru Morohashi, Hachioji (JP); Ryo Nagoshi, Sagamihara (JP); Yuan He, Hachioji (JP); Yutaka Ito, Taito-ku (JP)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 17/443,056

(22) Filed: Jul. 20, 2021

(65) Prior Publication Data
US 2021/0350844 A1    Nov. 11, 2021

Related U.S. Application Data

(62) Division of application No. 16/012,679, filed on Jun. 19, 2018, now Pat. No. 11,152,050.

(51) Int. Cl.
*G11C 7/00* (2006.01)
*G11C 11/406* (2006.01)

(52) U.S. Cl.
CPC ... *G11C 11/40615* (2013.01); *G11C 11/40611* (2013.01)

(58) Field of Classification Search
CPC ......... G11C 11/40615; G11C 11/40611; G11C 11/4087; G11C 2211/4065; G11C 11/40622

USPC ......................................................... 365/222
See application file for complete search history.

(56) References Cited

U.S. PATENT DOCUMENTS

| | | | |
|---|---|---|---|
| 3,633,175 A | 1/1972 | Harper | |
| 5,291,198 A | 3/1994 | Dingwall et al. | |
| 5,299,159 A | 3/1994 | Balistreri et al. | |
| 5,422,850 A | 6/1995 | Sukegawa et al. | |
| 5,638,317 A | 6/1997 | Tran | |

(Continued)

FOREIGN PATENT DOCUMENTS

| CN | 1195173 A | 10/1998 |
|---|---|---|
| CN | 101038785 A | 9/2007 |

(Continued)

OTHER PUBLICATIONS

US 11,264,075 B2, 03/2022, Bell et al. (withdrawn)

(Continued)

*Primary Examiner* — Tha-O H Bui
(74) *Attorney, Agent, or Firm* — Dorsey & Whitney LLP

(57) ABSTRACT

Apparatuses and methods for generating multiple row hammer address refresh sequences. An example apparatus may include an address scrambler and a refresh control circuit. The address scrambler may receive a first address, output a second address in response to a first control signal, and output a third address in response to a second control signal. The second address may physically adjacent to the first address and the third address may physically adjacent to the second address. The refresh control circuit may perform a refresh operation on the second address when the first control signal is active and perform the refresh operation on the third address when the second control signal is active.

16 Claims, 7 Drawing Sheets

(56) References Cited

U.S. PATENT DOCUMENTS

| | | |
|---|---|---|
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 | 12/2007 | Lien et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tawa |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 11,361,808 B2 | 6/2022 | Bell et al. |
| 11,386,946 B2 | 7/2022 | Ayyapureddi et al. |
| 11,398,265 B2 | 7/2022 | Wu et al. |
| 11,424,005 B2 | 8/2022 | Penney et al. |
| 11,462,291 B2 | 10/2022 | Pan |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |

(56) References Cited

U.S. PATENT DOCUMENTS

| | | |
|---|---|---|
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1* | 12/2008 | Hummler ......... G11C 29/50016 714/E11.054 |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1* | 7/2014 | Greenfield ......... G11C 11/40603 711/106 |
| 2014/0219043 A1 | 8/2014 | Jones et al. |
| 2014/0237307 A1 | 8/2014 | Kobia et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |

(56) References Cited

U.S. PATENT DOCUMENTS

| | | |
|---|---|---|
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Naie |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 5/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0398592 A1 | 12/2021 | Penney et al. |
| 2021/0407583 A1 | 12/2021 | Penney et al. |
| 2022/0069992 A1 | 3/2022 | Ayyapureddi |
| 2022/0165347 A1 | 5/2022 | Pan |
| 2022/0230672 A1 | 7/2022 | Ayyapureddi et al. |
| 2022/0415427 A1 | 12/2022 | Pan |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102.113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| GN | 1144434 A | 3/1997 |
| JP | H0773682 A | 3/1995 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |

(56) References Cited

FOREIGN PATENT DOCUMENTS

| WO | 2014120477 | | 8/2014 |
|----|------------|----|--------|
| WO | 2015030991 | A1 | 3/2015 |
| WO | 2017171927 | A1 | 10/2017 |
| WO | 2019222960 | A1 | 11/2019 |
| WO | 2020010010 | A1 | 1/2020 |
| WO | 2020191222 | A1 | 9/2020 |
| WO | 2021003085 | A1 | 1/2021 |
| WO | 2022108808 | A1 | 5/2022 |

OTHER PUBLICATIONS

U.S. Appl. No. 17/444,925 titled "Apparatuses and Methods for Countering Memory Attacks" filed Aug. 12, 2021.
[English Translation] KIPO's Notice of Preliminary Rejection, dated Nov. 11, 2021 for Korean Patent Application No. 10-2021-7001270.
U.S. Appl. No. 17/456,849 titled "Apparatuses, Systems, and Methods for Main Sketch and Slim Sketch Circuitfor Row Address Tracking" filed Nov. 29, 2021.
U.S. Appl. No. 17/565,119 titled "Apparatuses and Methods for Row Hammer Counter Mat" filed Dec. 29, 2021.
U.S. Appl. No. 17/565,187 titled "Apparatuses and Methods for Row Hammer Counter Mat" filed Dec. 29, 2021.
U.S. Appl. No. 17/822,033, titled, "Apparatuses and Methods for Tracking Word Line Accesses" filed Aug. 24, 2022, pp. all pages of applciation as filed.
U.S. Appl. No. 15/884,192 entitled 'Semiconductor Device Performing Row Hammer Refresh Operation' filed Jan. 30, 2018, pp. all.
U.S. Appl. No. 16/797,658, titles "Apparatuses and Methods for Controlling Refresh Operations", filed Feb. 21, 2020; pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. lll.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed Feb. 26, 2019; pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed Apr. 4, 2019; pp. all.
U.S. Appl. No. 16/936,297 titled "Apparatuses and Methods for Managing Row Access Counts" filed Jul. 22, 2020, pp. all.
U.S. Appl. No. 16/411,573 titled "Apparatuses, Systems, and Methods for a Content Addressable Memory Cell" filed May 14, 2019, pp. all.
U.S. Appl. No. 16/428,625 titled "Apparatuses and Methods for Tracking Victim Rows" filed May 31, 2019, pp. all.
U.S. Appl. No. 16/513,400 titled "Apparatuses and Methods for Tracking Row Accesses" filed Jul. 16, 2019, pp. all.
U.S. Appl. No. 17/060,403 titled "Apparatuses and Methods for Adjusting Victim Data" filed Oct. 1, 2020, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, p. all.
U.S. Appl. No. 16/546,152 titled "Apparatuses and Methods for Analog Row Access Trackeng" filed Aug. 20, 2019, pp. all.
U.S. Appl. No. 16/549,411 titled "Apparatuses and Methods for Dynamic Refresh Allocation" filed Aug. 23, 2019, pp. all.
U.S. Appl. No. 16/655,110 titled "Apparatuses and Methods for Dynamic Targeted Refresh Steals" filed Oct. 16, 2019, pp. all.
U.S. Appl. No. 17/154,945 titled "Apparatuses, Systems, and Methods for a Content Addressable Memory Cell" filed Jan. 21, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 17/168,036 titled "Apparatuses and Methods for Analog Row Access Tracking" filed Feb. 4, 2021, pp. all.
International Search Report and Written Opinion for PCT Appl. No. PCT/US2016/037673 dated Jun. 18, 2019, pp. all.
U.S. Appl. No. 16/788,657, titled "Semiconductor Device Performing Row Hammer Refresh Operation", dated Feb. 12, 2020, pp. all.
U.S. Appl. No. 15/881,256 entiled 'Apparatuses and Methods for Detecting a Row Hammer Attack With a Bandpass Filter' filed Jan. 26, 2018, pp. all.
U.S. Appl. No. 16/425,525 titled "Apparatuses and Methods for Tracking All Row Accesses" filed May 29, 2019, pp. all.
U.S. Appl. No. 16/427,105 titled "Apgaratuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 16/537,981 titled "Apparatuses and Methods for Controlling Targeted Refresh Rates" filed Aug. 12, 2019, pp. all.
U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/301,533 titled "Semiconductor Device Having Cam That Stores Address Signals" filed Apr. 6, 2021, pp. all.
U.S. Appl. No. 17/375,817 titled "Apparatuses and Methods for Monitoring Word Line Accesses" filed Jul. 14, 2021, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.

(56) References Cited

OTHER PUBLICATIONS

U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/431,641 titled "Apparatuses and Methods for Controlling Steal Rates" filed Jun. 4, 2019, pp. all.
U.S. Appl. No. 16/682,606, titled "Apparatuses and Methods for Distributing Row Hammer Refresh Events Across a Memory Device", filed Nov. 13, 2019, pp. all.
U.S. Appl. No. 17/102,266, titled "Apparatuses and Methods for Tracking Word Line Accesses", dated Nov. 23, 2020, pp. all.
U.S. Appl. No. 15/876,566 entitled 'Apparatuses and Methods for Calculating Row Hammer Refresh Addresses in a Semiconductor Device' filed Jan. 22, 2018, pp. all.
U.S. Appl. No. 15/656,084, titled: Apparatuses and Methods for Targeted Refreshing of Memory, filed Jul. 21, 2017, pp. all.
U.S. Appl. No. 16/459,520 titled "Apparatuses and Methods for Monitoring Word Line Accesses", filed Jul. 1, 2019, pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 16/459,507 titled "Apparatuses and Methods for Adjusting Victim Data", filed Jul. 1, 2919, pp. all.
U.S. Appl. No. 15/281,818, entitled: "Semiconductor Device" filed Sep. 30, 2016, pp. all.
Kim, et al., "Flipping Bits in MemoryWithout Accessing Them: an Experimental Study of DRAM Disturbance Errors", IEEE, Jun. 2014, 12 pgs.
Stout, Thomas et al., "Voltage Source Based Voltage-to-Time Converter", IEEE, downloaded Jul. 2020, pp. All.
Supplementary European Search Report for EP 19821884.4, dated Feb. 15, 2022; pp. all.
U.S. Appl. No. 17/446,710 titled "Apparatuses, Systems, and Methods for Determining Extremum Numericalvalues" filed Sep. 1, 2021.
U.S. Appl. No. 17/470,883 titled "Apparatuses and Methods for Tracking Victim Rows" filed Sep. 9, 2021.
U.S. Appl. No. 17/007,069 titled "Apparatuses and Methods for Providing Refresh Addresses" filed Aug. 31, 2020, pp. all.
[Engish Abstract Only] Zheng, Bin et al., "Design of Built-in DRAM for TFT-LCD Driver Chip "LCD and display", Issue 4", Aug. 15, 2009; pp. all.
U.S. Appl. No. 17/932,206, titled, "Apparatuses and Methods for Dynamically Allocated Aggressor Detection", filed Sep. 14, 2022, pp. all pages of application as filed.
[English Translation] Office Action for KR Appl. No. 10-2022-7026157, dated Sep. 23, 2022; pp. all.

\* cited by examiner

APPARATUSES AND METHODS FOR MULTIPLE ROW HAMMER REFRESH ADDRESS SEQUENCES

CROSS-REFERENCE TO RELATED APPLICATION(S)

This application is a divisional of U.S. patent application Ser. No. 16/012,679 filed Jun. 19, 2018 and issued as U.S. Pat. No. 11,152,050 on Oct. 19, 2021. The aforementioned application, and issued patent, is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored in the memory as charge accumulated in capacitors acting as memory cells, which will decay overtime unless periodically refreshed.

As memory components have decreased in size, the density of memory cells has greatly increased. Repeated access to a particular memory cell, or group of memory cells (often referred to as a 'row hammer') may cause an increased rate of data degradation in nearby memory cells. It may be desirable to identify and refresh memory cells affected by the row hammer.

DETAILED DESCRIPTION

The following description of certain embodiments is merely exemplary in nature and is in no way intended to limit the invention or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

The present disclosure is related to apparatuses and methods for refreshing different memory cells (or different groups of memory cells) affected by a row hammer. The memory cell which is being hammered may be referred to as an aggressor row (or aggressor address). The memory cell(s) which are being affected by the aggressor row may be referred to as victim rows (or victim addresses). Methods to mitigate row hammer effects may refresh victim rows which are adjacent to the aggressor row. However, victim rows may also exist which are not adjacent to the aggressor row.

The present disclosure provides for separately refreshing different victim rows (or groups of victim rows) each of which may have a different relationship to the aggressor address. The relationship that victim rows have to the aggressor row may be based on a physical relationship (e.g., distance or location) of the refreshed groups with respect to the aggressor row.

Different victim rows may experience the row hammer effect to different degrees. For example, one victim row may degrade faster than a different victim row. The degrees to which different victim rows are affected by the row hammer effect may be based on their relationship to the hammer row. For example, an adjacent victim row may undergo more rapid data degradation than a more distant victim row. For this reason, it may be desirable to refresh different victim rows at different rates.

Figure 1:
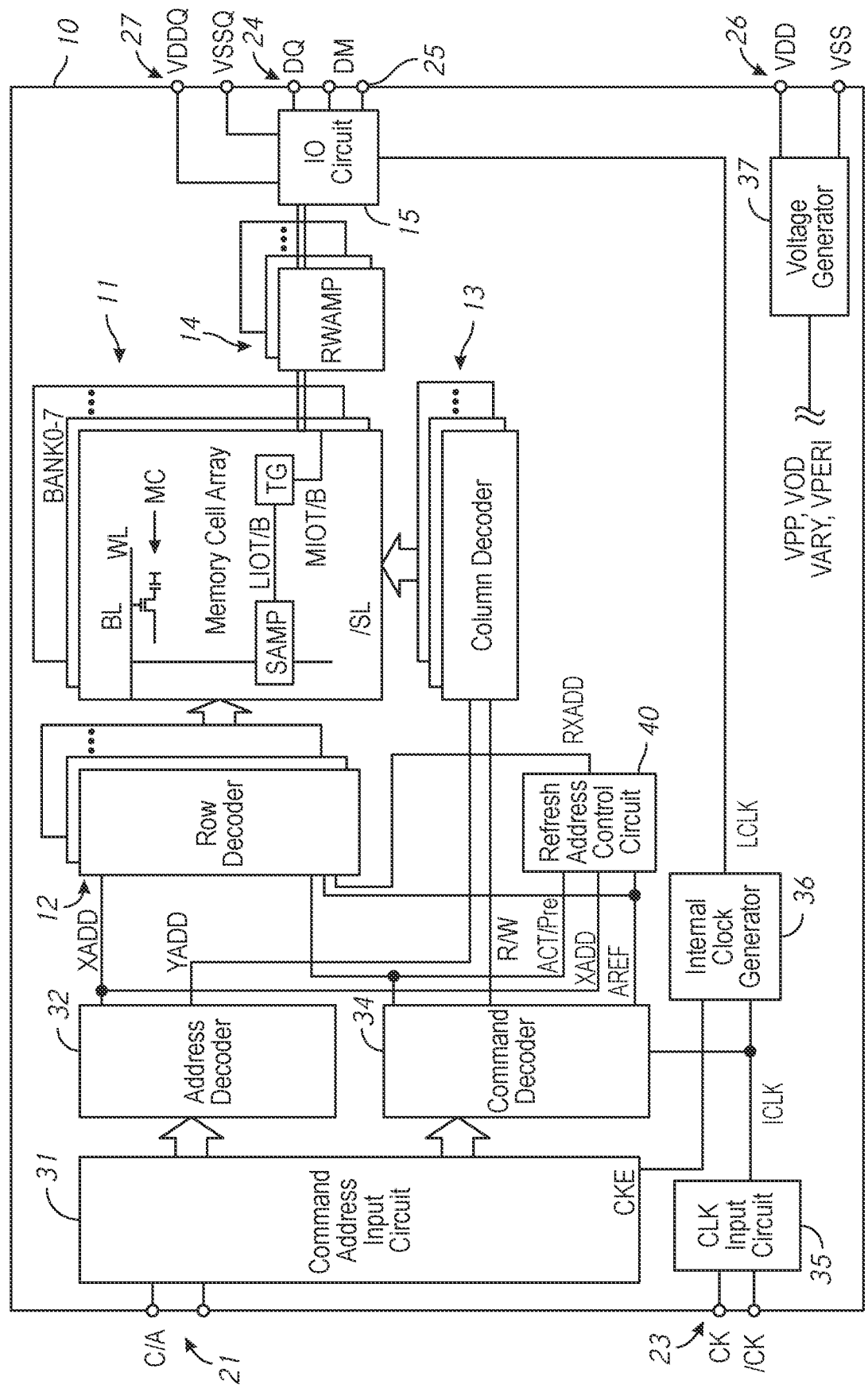
FIG. 1 is a block diagram of a semiconductor device according to an embodiment of the present disclosure.

FIG. 1 is a block diagram showing an overall configuration of a semiconductor device 10 according to at least one embodiment of the disclosure.

The semiconductor device 10 may include a synchronous DRAM (SDRAM), for example, a Double Data Rate 4 (DDR4) type integrated on a single semiconductor chip. The semiconductor device 10 may include a memory cell array 11 that is provided with a plurality of word lines WL and a plurality of bit lines BL and has a configuration in which memory cells MC are disposed at the intersections of the plurality of wordlines and the plurality of bitlines. Selection of the word lines WL is carried out by a row decoder 12, and selection of bit lines BL is carried out by a column decoder 13. The memory cell array 11, the row decoder 12, the column decoder 13, and a read/write amplifier 14 are each divided into a number of banks corresponding to a number of banks of the memory cell array 11. As shown, for example, in FIG. 1, the memory cell array 11 includes eight banks BANK0 to BANK7.

Moreover, the semiconductor device 10 is provided with command/address terminals 21, clock terminals 23, data terminals 24, data mask terminals 25, and power supply terminals 26 and 27 as external terminals.

The command/address terminals 21 receive external C/A signals which may be address signals ADD and/or command signals COM input from outside the semiconductor device 10. The C/A signals from command/address terminals 21 are supplied to a command address input circuit 31, which provides address signals ADD, and command signals COM. The address signals ADD are supplied to an address decoder circuit 32 which supplies a row address XADD to the row decoder 12 and supplies a column address YADD to the column decoder 13. The row address XADD is also supplied to a refresh address control circuit 40.

The command signals COM are supplied to a command decoder 34 that generates various internal commands by decoding the command signals COM. Examples of the internal commands include active signals ACT, pre-charge signals Pre, read/write signals R/W, and automatic refresh signals AREF. The active signals ACT, pre-charge signals PRE, and refresh signals AREF are all supplied to the refresh address control circuit 40.

The active signal ACT may be a pulse signal which is activated when the command signal COM indicates row access (active command). When the active signal ACT is activated, the row decoder 12 of a specified bank address is activated. As a result, the word line WL specified by the row address XADD is selected and activated. The pre-charge signal Pre may be a pulse signal which is activated when the command signal COM indicates pre-charge. When the pre-charge signal Pre is activated, the row decoder 12 of the specified bank address and the word line WL specified by the row address XADD controlled thereby are deactivated.

The read/write signal R/W may be a pulse signal which is activated when the command signal COM indicates column access (read command or write command). When the read/write signal R/W is activated, the column decoder 13 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 24 to outside via a sense amplifier SAMP, a transfer gate TG, the read/write amplifier 14, and an input/output circuit 15.

On the other hand, a write operation is performed when the active command and the write command are input, and the row address XADD and the column address YADD are input in synchronization with them, and, write data DQ is input to the data terminal 24. The write data DQ is supplied to the memory cell array 11 via the input/output circuit 15, the read/write amplifier 14, the transfer gate TG, and the sense amplifier SAMP and is written to the memory cell MC specified by the row address XADD and the column address YADD.

The refresh signal AREF may be a pulse signal which is activated when the command signal COM indicates an auto-refresh command. Also, when the command signal COM indicates a self-refresh entry command, the refresh signal AREF is activated. The refresh signal AREF may be activated once immediately after command input, and thereafter may be cyclically activated at desired internal timing. Thus refresh operations may continue automatically. A self-refresh exit command may cause the automatic activation of the refresh signal AREF to stop and return to an IDLE state.

The refresh signal AREF is supplied to the refresh address control circuit 40. The refresh address control circuit 40 supplies a refreshing row address RXADD to the row decoder 12, thereby activating the predetermined word line WL contained in the memory cell array 11, thereby refreshing the information of the corresponding memory cell MC. Other than the refresh signal AREF, the active signal ACT, the row address XADD, and the pre-charge signal Pre are supplied to the refresh address control circuit 40. The refresh address control circuit may control a timing of a refresh operation, and may utilize more than one timing and/or more than one method to calculate the refreshing address RXADD. The refresh address control circuit 40 may be controlled to change details of the refreshing address RXADD, or may operate based on internal logic.

The refresh address control circuit 40 may selectively use one or more of the active signal ACT, pre-charge signal Pre, row address XADD, and/or refresh signal AREF to output the refreshing row address RXADD. The refresh address control circuit 40 may calculate and output an automatic refresh address based on an automatic refresh operation indicated by the refresh signal AREF. The automatic refresh address may be output at a frequency based on a frequency of the refresh signal AREF. The refresh address control circuit 40 may selectively output a hammer refresh address, instead of an automatic refresh address, as the refreshing address RXADD. The hammer refresh address may be based on characteristics over time of the row addresses XADD received from the address decoder 32 in response to C/A inputs 21. The refresh address control circuit may sample the current row address XADD to determine its characteristics over time. The sampling may occur intermittently, with each sample acquired based on a random or pseudo-random timing. The refresh address control circuit 40 may use different methods to calculate a hammer refresh address based on the sampled row address XADD.

External clock signals CK and /CK are input to the clock terminals 23. The external clock signals CK and the external clock signals /CK are mutually complementary signals, and both of them are supplied to the clock input circuit 35. The clock input circuit 35 generates internal clock signals ICLK based on the external clock signals CK and /CK. The internal clock signals ICLK are supplied to the command decoder 34, an internal clock generator 36, etc. The internal clock generator 36 generates internal clock signals LCLK, which control the operation timing of the input/output circuit 15.

The data mask terminals 25 are the terminals to which data mask signals DM are input. When the data mask signal DM is activated, overwrite of corresponding data is prohibited.

The power supply terminals 26 are the terminals to which power supply potentials VDD and VSS are supplied. The power supply potentials VDD and VSS supplied to the power supply terminals 26 are supplied to a voltage generator 37. The voltage generator 37 generates various internal potentials VPP, VOD, VARY, VPERI, etc. based on the power supply potentials VDD and VSS. The internal potential VPP is the potential mainly used in the row decoder 12, the internal potentials VOD and VARY are the potentials used in the sense amplifier SAMP in the memory cell array 11, and the internal potential VPERI is the potential used in many other circuit blocks.

The power supply terminals 27 are the terminals to which power supply potentials VDDQ and VSSQ are supplied. The power supply potentials VDDQ and VSSQ supplied to the power supply terminals 27 are supplied to the input/output circuit 15. The power supply potentials VDDQ and VSSQ are the same potentials as the power supply potentials VDD and VSS, respectively, which are supplied to the power supply terminals 26. However, the dedicated power supply potentials VDDQ and VSSQ are used for the input/output circuit 15 so that power supply noise generated by the input/output circuit 15 does not propagate to other circuit blocks.

Figure 2:
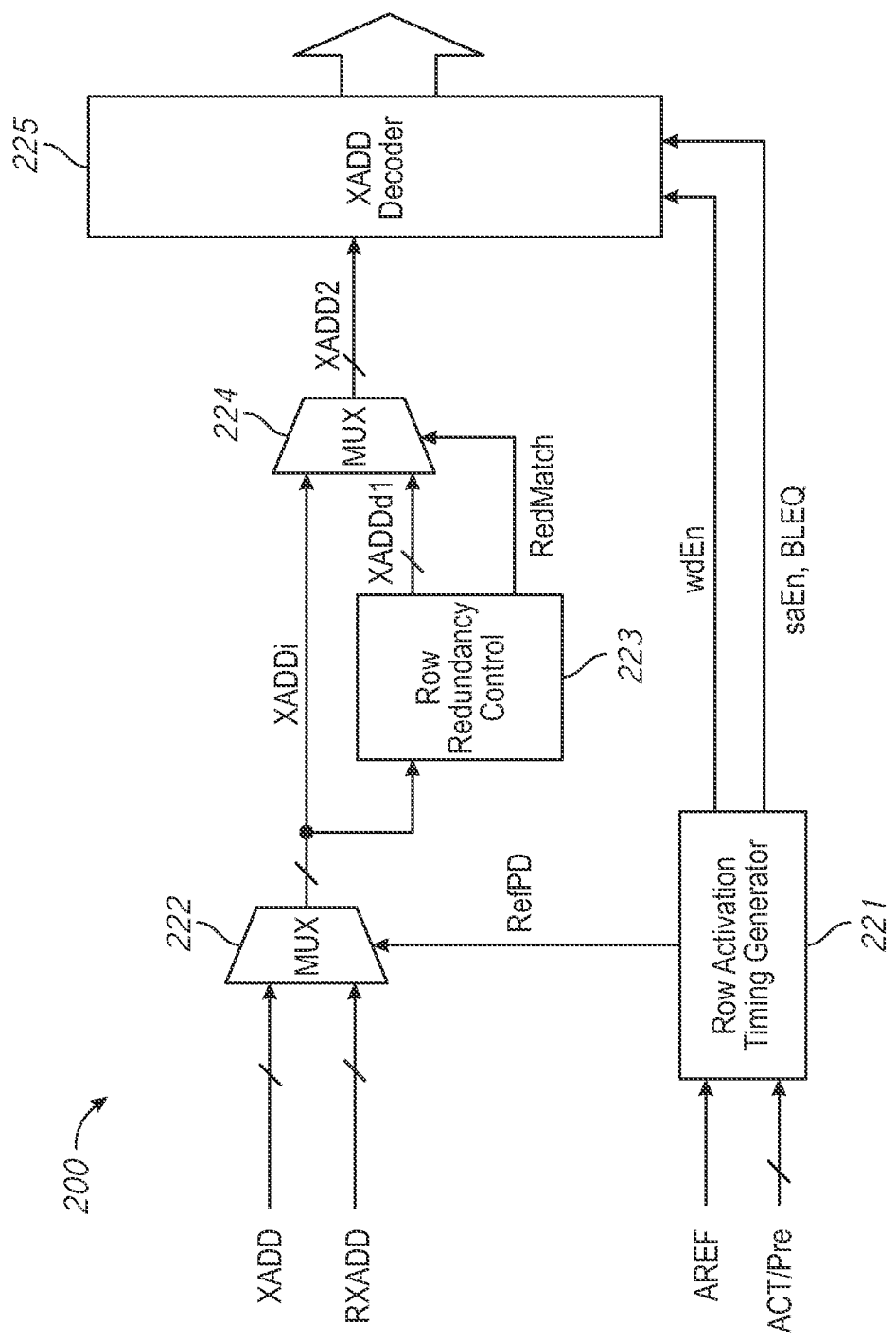
FIG. 2 is a block diagram of a row decoder according to an embodiment of the present disclosure.

FIG. 2 is a block diagram of a row decoder 200 according to an embodiment of the present disclosure. The row decoder 200 may be included in the row decoder 12 of FIG. 1 in some embodiments of the disclosure.

As shown in FIG. 2, the row decoder 200 is provided with a row activation timing generator 221, which receives the refresh signal AREF, the active signal ACT, and the precharge signal Pre and generates a state signal RefPD, a word-line actuation signal wdEn, a sense-amplifier actuation signal saEn, and a bit-line equalize signal BLEQ. The state signal RefPD is supplied to a multiplexer 222, which selects one of the row address XADD and the refreshing row address RXADD. An address XADDi selected by the multiplexer 222 is supplied to a row redundancy control circuit 223. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 224; wherein, if the hit signal RedMatch is not activated, the address XADDi is selected; and, if the hit signal RedMatch is activated, the address XADDd1 is selected. The selected address XADD2 is supplied to an X address decoder 225. The X address decoder 225 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

Figure 3:
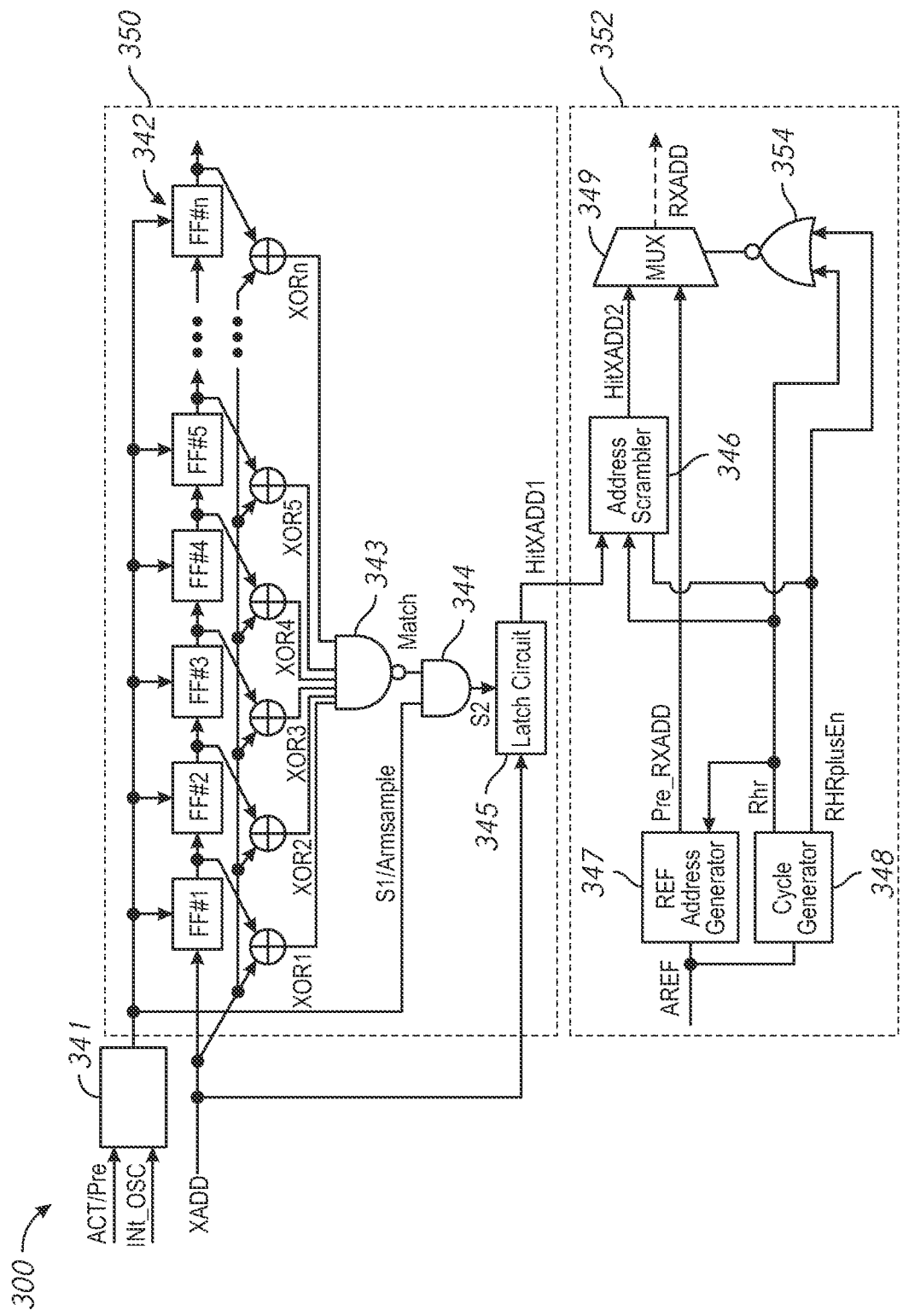
FIG. 3 is a block diagram of a refresh address control circuit according to an embodiment of the present disclosure.

FIG. 3 is a block diagram showing a configuration of a refresh address control circuit 300 according to an embodiment of the disclosure. The refresh address control circuit 300 may be included in the refresh address control circuit 40 of FIG. 1 in some embodiments of the disclosure.

As shown in FIG. 3, the refresh address control circuit 300 may include an address hammer detector 350 and an address selector 352. The address hammer detector 350 includes a sample circuit 341, a shift register 342, a NAND gate circuit 343, an AND gate circuit 344 and latch circuit 345.

The address hammer detector 350 may determine if a given address is considered to be a 'row hammer address' (or aggressor address). The address may be an address XADD currently being provided by an address decoder (e.g., address decoder 32 of FIG. 1) in response to an address ADD input to the device (e.g., on C/A terminals 21 of FIG. 1). The address XADD may be the row (wordline) component of the address ADD. The provided address XADD may change as new external addresses ADD are provided to the system. The address hammer detector 350 may have a sampling rate to sample (e.g., latch) the currently provided address XADD and save it for comparison with subsequently provided addresses. The address hammer detector 350 may intermittently (e.g., at random or pseudo-random timing intervals) sample a current address XADD being provided by the address decoder. The address hammer detector may compare the previously sampled addresses to the currently provided address XADD to determine if the current address has been sampled recently. The address hammer detector 350 provides an identified row hammer address addresses as row hammer address HitXADD1.

The address selector 352 may include a reference address generator 347, a cycle generator 348, an address scrambler 346, a multiplexer 349, and a NOR gate circuit 354. The address selector 352 accepts the output of the address hammer detector 350 and also the refresh signal AREF as inputs. The address selector calculates and selectively outputs a refreshing address RXADD based on these inputs. The address selector 352 may generate automatic refresh addresses Pre_RXADD in response to the refresh signal AREF. The address selector 352 may also selectively calculate hammer refresh addresses HitXADD2 based on an identified hammer address HitXADD1. The address selector 352 may provide hammer refresh addresses HitXADD2 resulting from different calculations. Which calculations are used to generate the hammer refresh address HitXADD2 may be based on, for example, an internal timing cycle. The different calculations may represent different relationships between hammer wordlines corresponding to the hammer address HitXADD1 and to refresh wordlines corresponding to the hammer refresh address HitXADD2. For example, the different relationships may be different physical relationships between wordlines corresponding to the addresses. In one embodiment, the address selector may calculate a first relationship where a refresh wordline corresponding to HitXADD2 is adjacent to an aggressor wordline corresponding to HitXADD1 and a second relationship where the refresh wordlines are non-adjacent (e.g., more distal from) the aggressor wordlines. Additional relationships may be used in other examples.

The address selector 352 provides one or more of these different calculated addresses as the refreshing address RXADD, which is then used to refresh corresponding locations of the memory. The address selector 352 may provide the automatic refresh address Pre_RXADD as the refresh address RXADD at a first rate. The address selector 352 may provide a first calculation of the hammer refresh address HitXADD2 as the refresh address RXADD at a second rate based on a number of times that the automatic refresh address Pre_RXADD was provided. The address selector 352 may provide a second calculation of the hammer refresh address HitXADD2 as the refresh address RXADD at a third rate based on a number of times that the first hammer refresh address HitXADD2 was provided.

The address hammer detector 350 includes a sampling signal generator 341 which generates a first sampling signal S1 (or 'Armsample') in response to the active signal ACT, the pre-charge signal Pre, and/or an internal oscillator signal Int_Osc. The active signal ACT and the pre-charge signal Pre may be generated by the command decoder 34 in response to C/A signals and may indicate activation or deactivation of a memory location corresponding to a specific row address XADD. The internal oscillator signal Int_Osc may be a periodic signal output by an internal oscillator circuit (not shown) of the semiconductor device 10 of FIG. 1. The internal oscillator circuit may output Int_Osc in a regular pattern while the semiconductor device 10 is in an operational mode except for a power-down mode and a self-refresh mode. The internal oscillator circuit may be a part of the semiconductor device 10, or may be a separate component.

Referring back to FIG. 3, the sampling circuit 341 produces the first sampling signal S1 which may be used to indicate that a currently provided address XADD will be sampled. The first sampling signal S1 may be a binary signal which signals the shift register 342 to latch a current address XADD. The sampling circuit 341 may generate the first sampling signal S1 at a rate intended to capture row hammer addresses. The row hammer address may be an address for a row of memory that is repeatedly accessed which may cause degradation in the storage of nearby memory rows. For example, the row hammer address may correspond to a row which is accessed a certain number of times within a set time period. The characteristics used to define occurrence of a row hammer (e.g., number of accesses, frequency of accesses, and/or duration of each access) may be chosen based on physical characteristics of the memory, such as the physical spacing between cells of the memory cell array 11. Row hammers may happen in different patterns (e.g., rapid access over a short period of time, slow access occurring over a long period of time, a single access with a long duration). The sampling circuit 341 may produce first sampling signal S1 at a rate to capture a variety of row hammer patterns. The first sampling signal S1 may be generated at an intermittent and/or unpredictable rate, such as being generated at random or pseudo-random time intervals. The rate of first sampling signal S1 may involve randomness to increase a probability of sampling different patterns of row hammer. The intervals between activations of the first sampling signal S1 may, at least partially, depend on expected characteristics of a row hammer, a frequency of expected row hammer events, and/or a number of registers (depth) of the shift register 342. For example, if the shift register 342 has a greater depth, then the first sampling signal S1 may be activated less frequently, since there will be more sampled addresses available for comparison.

The rate of activations of the first sampling signal S1 may be varied based on rates of activations of command signals. The sampling circuit 341 may use the inputs ACT, Pre, and/or Int_Osc as a basis for controlling a rate of sampling signal S1 which captures different types of row hammer patterns. For example, if the inputs ACT and Pre are more frequently activated, that may indicate an increased chance that one or more addresses are being frequently accessed by the system. Thus, the sampling circuit 341 may increase a rate at which the first sampling signal S1 is generated in response to an increase in the rates of the ACT and Pre signals. Int_Osc may be used to detect addresses which have been kept active for a certain amount of time (e.g., in an 'active standby' mode). Since the internal oscillator signal Int_Osc is periodic and continuous over time, first sampling signal S1 may intermittently be generated even when input signals ACT and Pre are less frequently active. Thus, the internal oscillator signal Int_Osc may allow for the first sampling signal S1 to be activated at a certain 'baseline' rate.

In one embodiment, the sampling circuit 341 may include a counter circuit and a pseudo-random generator which are clocked by the inputs ACT, PRE, and Int_Osc. An example of a sampling circuit that, in certain embodiments, may be used as the sampling circuit 341 may be found in U.S. Pat. No. 9,805,783, issued Oct. 31, 2017, the entire contents of which are disclosed by reference herein. By producing the first sampling signal S1 at random or pseudo-random timing based on input signals and an internal oscillator, a broad range of row hammer events may be detected without the need to track every current address XADD provided by the row decoder.

The shift register 342 may store a certain number of previously sampled addresses for comparison with a current address. The shift register 342 may latch current row addresses XADD in response to the sampling signal S1. The shift register 342 may be made of a number (n) of storage or latch circuits, such as flip-flop circuits (FF #1 to FF #n). In one example, the flip-flop circuits are arranged in a cascade fashion such that each flip-flop circuit (e.g., an $i^{th}$ circuit FF #i) accepts an output of a previous flip-flop circuit (e.g., FF #i−1) as an input, and outputs to a subsequent flip-flop circuit (e.g., FF #i+1). The first flip-flip circuit is provided the current row address XADD. Each flip-flop circuit also has a clock node connected to the first sampling signal S1 provided by the sampling circuit 341. In this manner, the first sampling signal S1 may cause the shift register 342 to record the n most recent addresses which were being provided by the row decoder at each the n most recent first sampling signal S1 activations.

As an example of the operation of the shift register 342, the first flip-flop circuit FF #1 responds to the first sampling signal S1 being active and latches the current address XADD. A subsequent activation of the first sampling signal S1 may cause the address XADD to be moved from FF #1 to FF #2, while a new address XADD' is latched in FF #1. As the first sampling signal S1 continues to be activated, the address XADD will eventually be moved into a final flip-flop circuit FF #n. When the first sampling signal S1 is activated again, the address XADD may be discarded from the shift register. Other operations may be used in other examples.

The shift register 342 also includes a number of comparator circuits corresponding to each of the latch circuits. The comparator circuits may determine if a currently provided address XADD matches one or more of the addresses stored in the latch circuits. The comparator circuits are shown in the embodiment of FIG. 3 as exclusive OR (XOR) gate circuits, although other comparator circuits may be used in other embodiments of the disclosure. Each of the comparator circuits accepts the current row address XADD as first input, and an output of the corresponding storage circuit as a second input (e.g., comparator XOR3 may accept the current row address XADD and the address stored in flip-flop circuit FF #3 as its inputs). In this manner, the addresses latched in each flip-flop circuit of the shift register 342 may be compared to the current address XADD. The comparators may produce a signal Match to indicate that the current address XADD matches one or more of the addresses stored in the shift register 342. In one embodiment, each of the comparator circuits may output a low logic level if there is a match between the current address XADD and the address latched in the corresponding flip-flop circuit. The outputs of all of the comparator circuits may be provided as inputs to a NAND gate circuit 343, which outputs the signal Match. The signal Match is positive (a high logic level) when any of the inputs are at a low logic level (e.g., there currently provided address XADD matches at least one of the addresses stored in the shift register 342). Other methods of producing Match may be used in other examples.

The signal Match and the first sampling signal S1 are both provided to an AND gate circuit 344. When both Match and the first sampling signal S1 are active, the AND gate circuit outputs an active second sampling signal S2 (a high logic level). Activation of the second sampling signal S2 may cause a latch circuit 345 to store the current row address XADD. The stored address may then be output by the latch circuit 345 as a hammer address HitXADD1.

In this manner, the address hammer detector 350 monitors addresses XADD and outputs them as hammer address HitXADD1 when the current row address matches one of n recently sampled row addresses. The address hammer detector 350 may intermittently store addresses XADD based on a sampling rate which may be based on the rates of inputs ACT, Pre, or Int_Osc and/or may be random or pseudo-random. The address hammer detector 350 may store up to n recent addresses in this manner, compare them to the current address XADD, and store them as hammer address HitXADD1 in latch circuit 345. Because the address hammer detector 350 may records addresses in a random or semi-random manner, not all addresses that fit a set of row hammer criteria will necessarily be detected by the address hammer detector 350. However, the intermittent sampling also means that the higher the access rate of a given row (or the longer that row is activated), the higher the probability that a row hammer will be detected by the address hammer detector 350. Thus, the rate of the first sampling signal S1 may allow for capture of all or a portion of expected row hammer addresses.

The address selector 352 is provided the hammer address HitXADD1 and the automatic refresh signal AREF as inputs. The address selector 352 may calculate and selectively output a refreshing address RXADD in response to these inputs. The refresh address generator 347 generates a refresh address Pre_RXADD based on the refresh signal AREF. The cycle generator 348 periodically outputs a first command signal Rhr or a second command signal RHRplusEn based on the refresh signal AREF. The address scrambler 346 calculates a hammer refresh address HitXADD2 based on the hammer address HitXADD1 provided by the address hammer detector 350 in response to the first and second refresh command signal Rhr, RHRplusEn. As previously described, the hammer refresh address HitXADD2 may be calculated in different ways. The calculation used to provide the hammer refresh address HitXADD2 may be based on the status of the first and second command signals. The address selector 352 outputs a refreshing address RXADD which is the refresh address Pre_RXADD or the hammer refresh address HitXADD2 based on the first and second refresh command signals Rhr, RHRplusEN. The refreshing address RXADD is provided to a row decoder, for example, row decoder 200 of FIG. 2 in some embodiments, so that a corresponding row of memory may be refreshed.

The address selector 352 includes a refresh address generator 347 which generates an automatic refresh address Pre_RXADD in response to the refresh signal AREF. The automatic refresh address Pre_RXADD may be part of a sequence of addresses to be refreshed as part of an automatic refresh operation. The refresh address generator 347 may update the current automatic refresh address Pre_RXADD to a next address in the sequence in response to the refresh signal AREF. The refresh address generator 347 is also provided the first command signal Rhr from cycle generator 348. When the first command signal is active, the refresh address generator 347 may be controlled to stop updating the automatic refresh address Pre_RXADD even if the automatic refresh signal AREF is active. As described herein, since the command signals indicate that a row hammer refresh operation is to be conducted instead of an automatic refresh operation, this allows the automatic refresh operation to be suspended while the row hammer refresh is carried out, and resumed when the command signals are not active.

The refresh cycle generator 348 determines if an automatic refresh operation or a row hammer refresh operation will occur. The refresh cycle generator 348 may also determine which row hammer refresh operation will occur. The refresh cycle generator 348 is provided the refresh signal AREF and selectively provides the first command signal Rhr and/or the second command signal RHRplusEn in response. As described herein, the first command signal Rhr may indicate a first row hammer refresh operation (e.g., refresh the rows adjacent to a row corresponding to HitXADD1). The second command signal RHRplusEn may indicate a second row hammer refresh operation (e.g., refresh rows non-adjacent to a row corresponding to HitXADD1). The second row hammer refresh operation may only be indicated when both the first and second command signals are active. As described herein, the refresh cycle generator 348 may periodically provide one (or both) of the first and second command signals in response to a rate of the automatic refresh signal AREF. The rates that the first and second command signals are provided may be different from each other.

The address selector 352 may also include an address scrambler 346, which calculates one or more addresses to be refreshed based on row hammer addresses identified by the address hammer detector 350 and which row hammer refresh operation is indicated by the refresh cycle generator 348. The address selector 352 may be provided the hammer address HitXADD1, the first command signal Rhr, and the second command signal RHRplusEn as inputs. The address scrambler may provide a hammer refresh address HitXADD2 in response to these inputs. The hammer refresh address HitXADD2 may be an address for a memory location (e.g., a wordline) that may be affected by repeated activation of the memory location corresponding to the hammer address HitXADD1. In other words, the hammer address HitXADD1 may be an 'aggressor' address, and the hammer refresh address HitXADD2 may be a 'victim' address. Different calculations may be used for generating different victim addresses as the hammer refresh address HitXADD2.

The address scrambler 346 may calculate the hammer refresh address HitXADD2 based on the hammer address HitXADD1. The address scrambler may employ different calculations based on the state of the first command signal Rhr and the second command signal RHRplusEn. In one example, a first calculation may be used when Rhr alone is active, and a second calculation may be used when both Rhr and RHRplusEn are active. The calculations may provide hammer refresh addresses HitXADD2 corresponding to wordlines which have a known physical relationship (e.g., a spatial relationship) with a wordline corresponding to the hammer address HitXADD1. The calculations may result in a single hammer refresh address HitXADD2 in some embodiments of the disclosure. The calculations may result in a sequence of hammer refresh address HitXADD2 in other embodiments of the disclosure. The calculations triggered by the first command signal Rhr may provide hammer refresh addresses HitXADD2 corresponding to first refresh wordlines of a memory with a first physical relationship to an aggressor wordline corresponding to the hammer address HitXADD1 and the second command signal RHRplusEn may provide hammer refresh addresses HitXADD2 corresponding to second refresh wordlines having a second physical relationship to the aggressor wordline.

In one embodiment, the first calculation triggered by first command signal Rhr causes the address scrambler 346 to output a pair of addresses which are adjacent to the hammer address HitXADD1 (e.g., HitXADD2=HitXADD1+/−1). The second calculation may be triggered by both first command signal Rhr and second command signal RHRplusEn being active, and may cause the address scrambler 346 to output a pair of addresses which are adjacent to the adjacent addresses of the hammer address HitXADD1 (e.g., HitXADD2=HitXADD1+/−2). Other calculations are possible in other example embodiments. For example, the first calculation may be based on a physical relationship with the hammer address HitXADD1, while the second calculation may be based on a physical relationship with the address(es) provided by the first calculation.

The address selector 352 may include a multiplexer 349 which accepts the automatic refresh address Pre_RXADD and the hammer refresh address HitXADD2 provided by the address scrambler 346 and outputs one of them as the refreshing address RXADD. The multiplexer 349 may select between the two refresh addresses based on the first and second command signals Rhr and RHRplusEn. For example, a NOR gate circuit 354 is provided the first and second command signals Rhr and RHRplusEn and an output is provided to the multiplexer 349 to control selection of providing the Pre_RXADD or HitXADD2 addresses as the refreshing address RXADD. The NOR gate circuit 54 outputs a low logic level if either or both of the first and second command signals Rhr, RHRplusEn is active (e.g., at a high level). The multiplexer 349 outputs the hammer refresh address HitXADD2 in response to that low logic level. Thus, the multiplexer 349 outputs the hammer refresh address HitXADD2 if either of the command signals indicating a row refresh is active, and outputs the automatic refresh address Pre_RXADD otherwise.

In this manner, the address selector 352 selectively outputs a refreshing row address RXADD, which may be used by the row decoder (e.g., row decoder 12 of FIG. 2) to refresh a given memory location corresponding to that address. The cycle generator 348 of the address selector 352 selectively activates the first command signal Rhr and the second command signal RHRplusEn to cause the address scrambler 346 to calculate a hammer refresh address HitXADD2 based on the hammer address HitXADD1 identified by the address hammer detector 350, and causes the address selector 350 to output it as the refreshing row address RXADD. The cycle generator 348 controls when a hammer refresh address HitXADD2 is calculated, and which calculations should be performed.

Figure 4:
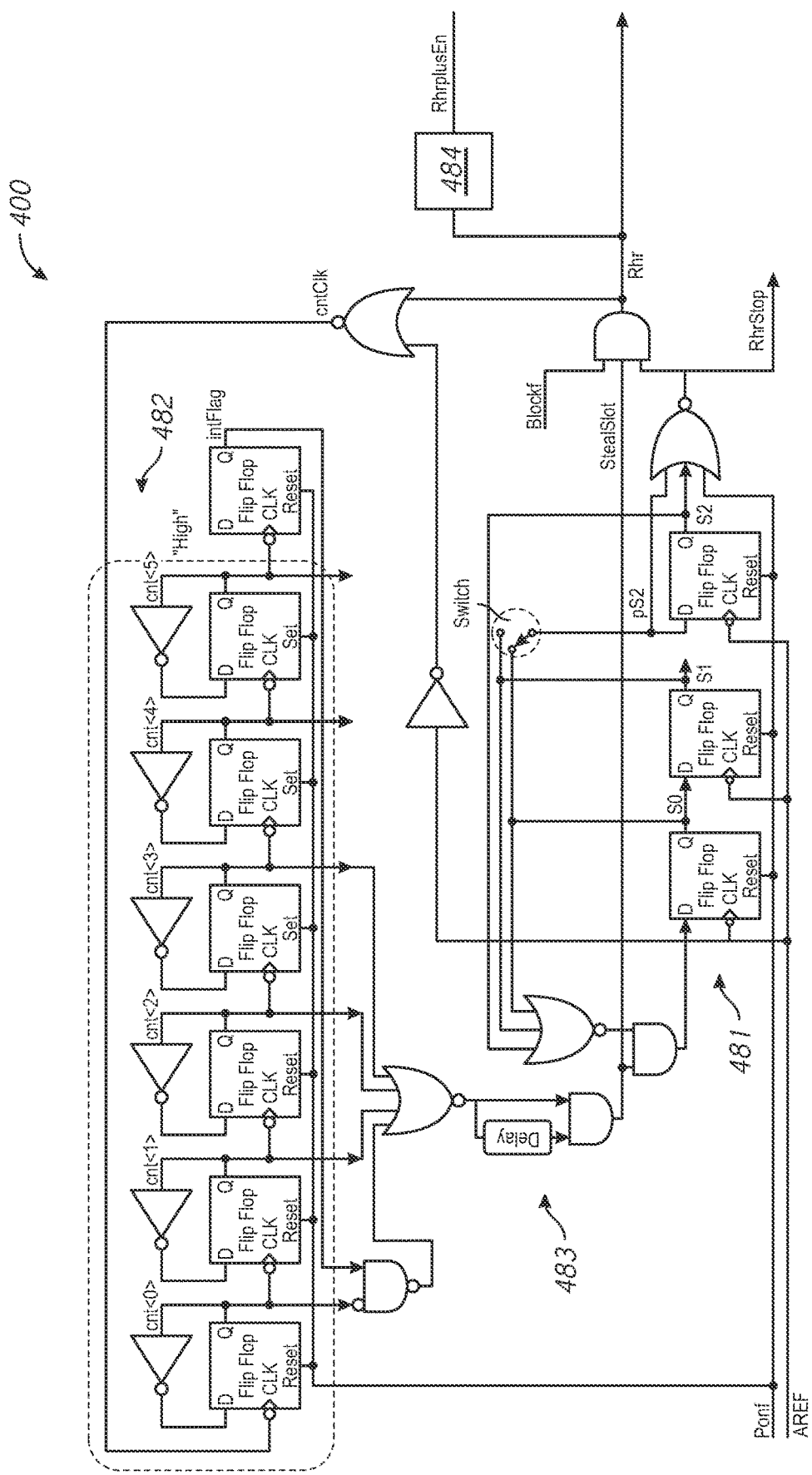
FIG. 4 is a block diagram of a refresh cycle generator according to an embodiment of the present disclosure.

FIG. 4 is a block diagram of a refresh cycle generator 400 according to an embodiment of the present disclosure. The refresh cycle generator 400 may, in some embodiments, be used as the refresh cycle generator 348 of FIG. 3.

The refresh cycle generator 400 includes a shift register 482, a combination logic circuit 483, a counter circuit 481, and a second refresh cycle generator 484. The refresh cycle generator provides the first command signal Rhr and the second command signal RHRplusEn to determine which calculations will be used to generate a hammer refresh address HitXADD2 from a hammer address HitXADD1. The refresh cycle generator 400 may provide the first and second command signals at different rates. The refresh cycle generator 400 may provide the first command signal Rhr at a rate based on the rate of the refresh signal AREF. As described herein, the second refresh cycle generator 484 may provide the second command signal RHRplusEn at a second rate based on the rate of the first command signal Rhr.

In the example circuit shown in FIG. 4, the refresh cycle generator 400 may produce the first command signal Rhr in response to the refresh signal AREF being activated a predetermined number of times. The refresh signal AREF is provided to the shift register 482. The shift register 482 counts a number of times that the refresh signal AREF is activated. As shown, a NOR gate is used such that the shift register 482 only records a signal when the first command signal Rhr is not active. The counter circuit 481 determines a duration of the first command signal Rhr relative to refresh signal AREF. The counter circuit 481 uses the refresh signal AREF as a clock synchronization signal. The counter circuit 481 may have a switch to select between different durations. As shown, the counter circuit 481 may produce an RhrStop signal after two refresh signals AREF such that the first command signal Rhr lasts for a duration of two of the refresh signals AREF. The combination logic circuit 483 may produce the first command signal Rhr in response to the current state of the counter circuit 481 and the shift register 482. As shown, the refresh cycle generator may produce a first command signal Rhr after 4 activations of the refresh signal AREF, and the first command signal Rhr may last for two activations of the refresh signal AREF (e.g., the first command signal Rhr is provided at the activation of every $5^{th}$ refresh signal AREF, and stops being provided at the deactivation of every $6^{th}$ refresh signal AREF).

The refresh cycle generator 400 may also be provided with a power on signal Ponf. The power on signal Ponf is provided to the shift register 482 and to the counter circuit 481. The power on signal Ponf may be provided by the system (e.g., one or more components of the semiconductor device 10 of FIG. 1) to signal that the system has been powered on. The power on signal Ponf may be used to initialize the counter circuit 481 and the shift register 482 to a known value (e.g., '0') such that the components of the refresh cycle generator 400 are synchronized at start up.

Figure 5:
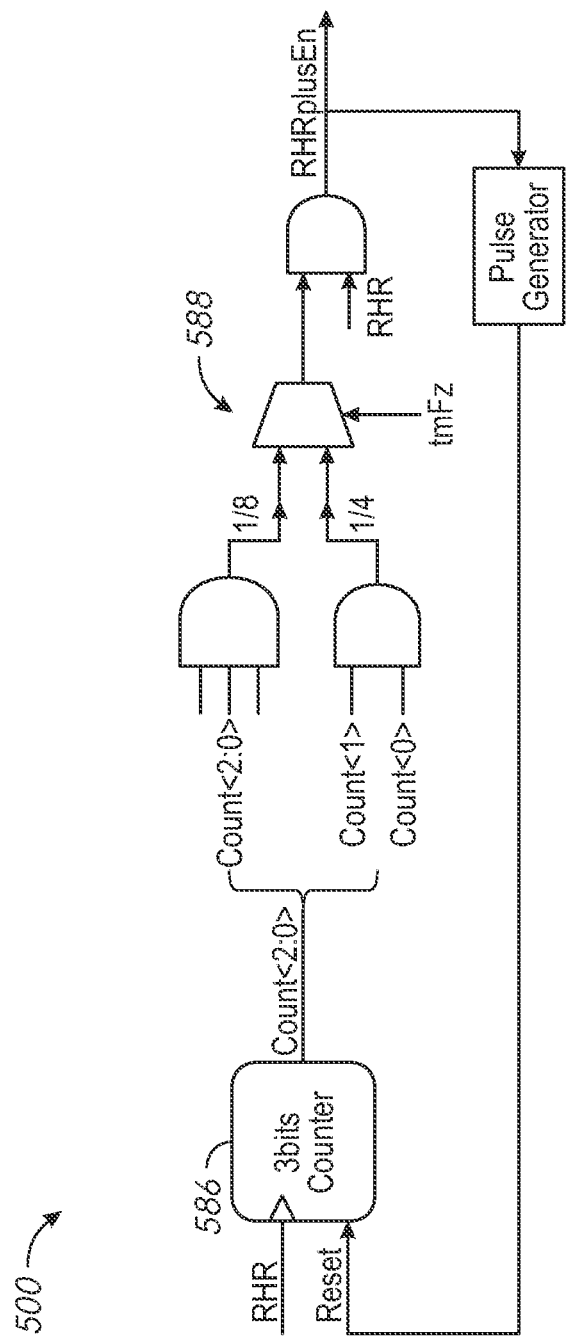
FIG. 5 is a block diagram of a second refresh cycle generator according to an embodiment of the present disclosure.

FIG. 5 is a block diagram of a second refresh cycle generator 500 according to an embodiment of the present disclosure. The second refresh cycle generator 500 may be used, in some embodiments, as the second refresh cycle generator 484 of FIG. 4.

The second refresh cycle generator 500 may generate the second command signal RHRplusEn in response to a number of activations of the first command signal Rhr. The second command signal RHRplusEn in combination with the first command signal Rhr may indicate that a second refresh operation is to take place, different than the refresh operation which is indicated by the first command signal Rhr alone. The first and second command signals may be produced at different rates. The rates at which the first and second command signals are produced may be determined based on the row hammer refresh operation they indicate. As an example, the first command signal Rhr may refresh a row which is adjacent to an identified row hammer and the second command signal RHRplusEn may refresh a row which is non-adjacent to the identified row hammer. In this situation, the adjacent rows may be expected to be more affected by a row hammer effect than the non-adjacent rows, and so Rhr may be produced more frequently than RHRplusEn. Other refresh operations may correspond to other rates of the first and second command signal in other examples.

As shown in the example circuit of FIG. 5, the second refresh cycle generator 500 may produce the second command signal RHRplusEn at a selected fraction of the number of activations of the first command signal Rhr (e.g., the second command signal RHRplusEn may be produced once for some number of activations of first command signal Rhr). The second refresh cycle generator 500 may output the second command signal RHRplusEn when the first command signal Rhr is also active. The second refresh cycle generator 500 includes a counter 586 and a ratio selector 588. The counter 586 may produce a count signal in response to a number of activations of the first command signal Rhr. The counter 586 may have a number of bits selected to correspond to a smallest selectable ratio between the signals. The ratio selector 588 accepts the count signals produced by the counter 586. The ratio selector 588 may accept a command signal (tmFz) to selectively change the ratio of the first and second command signals.

In the example circuit of FIG. 5, the second refresh cycle generator 500 outputs the second command signal RHRplusEn for every 8 or every 4 activations of the first command signal Rhr. The counter 586 is a 3-bit counter which increments each time the first command signal Rhr is activated. All three bits of the counter are provided to a first logic gate of the ratio selector 588, while only the two least significant bits are provided to a second logic gate of the ratio selector 588. The first and second gates may be AND gates, such that a positive signal is produced from the first gate when all three bits of the counter 586 are positive (e.g., the counter is providing a value of 7), and a positive signal is produced from the second gate when the two least significant bits are positive (e.g., the counter is providing a value of 3 or 7). The outputs of the first and second gates are provided to a multiplexer, which also accepts the command signal tmFz as a selector input. Based on the state of tmFz, the multiplexer either provides the output of the first or second logic gate. The ratio selector 588 also includes an AND gate which is provided the output of the multiplexer and the first command signal Rhr. The AND gate outputs the second command signal RHRplusEn when the output of the multiplexer and the first command signal Rhr are both positive. The second command signal RHRplusEn is provided to a pulse generator, which on a falling edge of the second command signal RHRplusEn provides a reset signal to the counter 586, which resets the counter to a value of 0. Thus, the input to the multiplexer of the ratio selector 588 determines whether second command signal RHRplusEn will be output once every 4 activations of the first command signal (when the output of the second logic gate is passed through the multiplexer) or once every 8 activations of the first command signal Rhr (when the output of the first logic gate is passed through the multiplexer).

Figure 6:
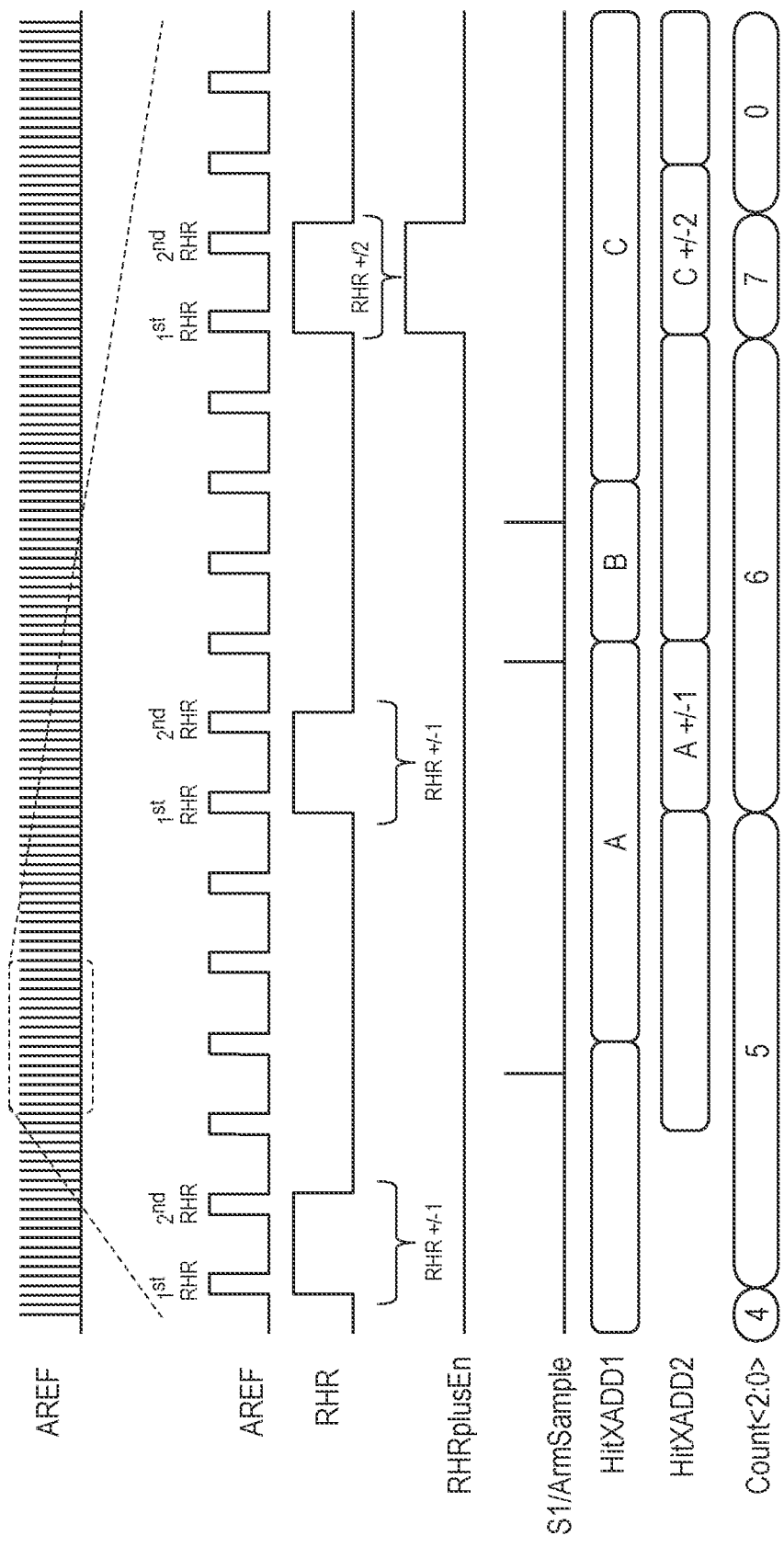
FIG. 6 is a timing chart showing signals produced during operation of a refresh cycle generator according to an embodiment of the present disclosure.

FIG. 6 is a timing chart showing signals produced during operation of a refresh cycle generator according to an embodiment of the present disclosure. In some embodiments, the signals of the timing chart of FIG. 6 may be signals of the address refresh control circuit 300 of FIG. 3. The timing chart of FIG. 6 may be the operation of a particular address refresh circuit. In particular, FIG. 6 shows the timing of an address refresh control circuit 300 using the refresh cycle generator 400 of FIG. 4 and the second refresh cycle generator 500 of FIG. 5. Other address refresh circuits may receive and/or produce different patterns of the signals and/or different signals. The timing chart as shown displays the operation of a refresh control circuit which refreshes first victim rows at a first rate based off of the rate of a refresh signal AREF, and second victim rows refreshed at a second rate which is a fraction of the first rate. In this case, the first victim rows are a pair of rows adjacent to the row being hammered. The second victim rows are a pair of rows which are each adjacent to one of the first victim rows. Other circuits may employ other operations wherein, for example, neither set of rows are adjacent to the aggressor row.

The first two lines of FIG. 6 show a refresh signal AREF. The second line shows an expanded portion of the refresh signal AREF signal shown in the first line. The refresh signal AREF may be a sequence of pulses (e.g., from a low to a high logic level for a set duration). The refresh signal AREF may occur in a set pattern, at regular intervals in time. The refresh signal AREF may control an automatic refresh procedure, which refreshes a sequence of wordlines of a memory. As discussed herein, the refresh signal AREF may be used to trigger a cycle generator (e.g., cycle generator 348 of FIG. 3) to produce first and second command signals. As shown, some of the individual pulses have been labeled "$1^{st}$ RHR" or "$2^{nd}$ RHR" to indicate that a first or second row hammer refresh operation is being conducted instead of the automatic refresh operation during the period when that particular pulse is active.

The third line of FIG. 6 shows first command signal Rhr. As shown, the first command signal Rhr is a pulse which is produced in response to a certain number of activations of the refresh signal AREF. The first command signal Rhr may have a duration longer than the duration of each of the pulses of the refresh signal AREF. In this example, the first command signal Rhr indicates that rows adjacent to a row identified as a hammer row are to be refreshed (e.g., the refreshed addresses are the hammer address +/−1). In this particular embodiment, the refresh cycle generator 400 of FIG. 4 is used to produce the first command signal Rhr. The first command signal Rhr activates after four activations of the refresh signal AREF. Based on the shift register 482 of FIG. 4, the first command signal Rhr may activate along with the rising edge of every $5^{th}$ activation of the refresh signal AREF. Since two refresh operations (+1 and −1) are indicated by the first command signal Rhr, the first command signal may last for a duration of two pulses of the refresh signal AREF. The counter 483 of FIG. 4 may cause the first command signal Rhr to be deactivated along with a falling edge of every $6^{th}$ activation of the refresh signal AREF. When the first command signal Rhr is active, a first activation of refresh signal AREF will instead refresh a first adjacent address ("$1^{st}$ RHR"), and the second activation of refresh signal AREF will refresh a second adjacent address ("$2^{nd}$ RHR").

The fourth line of FIG. 6 shows second command signal RHRplusEn. As shown, the second command signal RHRplusEN may activate after a given number of activations of the first command signal Rhr. In the embodiment of FIG. 6, the second command signal RHRplusEn may activate on the eighth activation of the first command signal Rhr (some previous activations of the first command signal Rhr are not shown) based on the counter 586 of FIG. 5. The second command signal RHRplusEn may have a duration equal to a duration of the first command signal Rhr due to the final AND gate of the ratio selector 588. When both the first and second command signals are active, a second refresh operation may be indicated. In this example, the first and second command signals together indicate that a non-adjacent row to an identified hammer row are to be refreshed (e.g., the refreshed addresses are the hammer address +/−2).

The fifth line of FIG. 6 shows first sampling signal S1 (ArmSample). The first sampling signal S1 may be a signal which is internal to a circuit which outputs the first and second command signals (e.g., address refresh control circuit 300 of FIG. 3). The first sampling signal S1 is activated in an intermittent fashion with random or semi-random timing intervals between activations. The first sampling signal S1 may cause a current address to be sampled. The sampled addresses may be used to determine if a current address is a row hammer address HitXADD1. The row hammer address HitXADD1 may be provided when the first sampling signal S1 is active.

The sixth line of FIG. 6 shows row hammer address HitXADD1. As shown, there are 3 different addresses A, B, and C which are each identified as a row hammer address HitXADD1 after being sampled by an activation of the first sampling signal S1. For purposes of this example, it may be assumed that each address A, B, and C had previously been sampled (e.g., the addresses are still stored in the latch circuit 342 of FIG. 3). Each of the three addresses may be provided as row hammer address HitXADD1 for a different period of time, based on the activations of the first sampling signal S1.

The seventh line of FIG. 6 shows row hammer refresh address HitXADD2. The hammer refresh address HitXADD2 is calculated in response to the first and second command signals Rhr, RHRplusEn based on the currently provided row hammer address HitXADD1. As shown, a row hammer refresh address is calculated for row hammer address 'A' when the first command signal Rhr is activated. Since only the first but not second command signals are activated at this point, a first refresh operation is carried out in which adjacent rows to the row corresponding to address A are refreshed, and A+/−1 is output as the hammer refresh address HitXADD2. An address corresponding to A+1 may be output during the refresh signal AREF pulse labeled "1st RHR", and an address corresponding to A−1 may be output during the refresh pulse labeled "2nd RHR".

When both the first and second command signals activate, the address C is the row hammer address HitXADD1, and a second refresh operation causes C+/−2 to be provided as the hammer refresh address HitXADD2. An address corresponding to C+2 may be output during the refresh signal AREF pulse labeled "1st RHR", and an address corresponding to C−2 may be output during the pulse labeled "2nd RHR". The irregular timing of the first sampling signal S1 means that addresses A and C each have different refresh operations calculated, and address B has none. Various patterns and sequences of address refreshes may be provided based on the operation of the address refresh circuit.

The eighth line of FIG. 6 shows a counter signal Count<2:0> to determine when the second command signal RHRplusEn will activate. The counter signal may determine the rate at which the second command signal RHRplusEn is provided based on a rate of the first command signal Rhr. The counter signal may increase each time that the first command signal Rhr activates. As shown here, the counter is the three-bit counter 586 of FIG. 5 and the ratio selector 588 of FIG. 5 is set to accept the output of the first logic gate (which is positive only when all 3 bits of the counter are positive). When the counter reaches its maximum value (e.g., 7) the second command signal RHRplusEn is activated in addition to the first command signal Rhr. A falling edge of the second command signal RHRplusEn may reset the counter back to 0. Although not shown in the time window of FIG. 6, the counter signal Count<2:0> will then begin incrementing with each activation of the first command signal Rhr.

Figure 7:
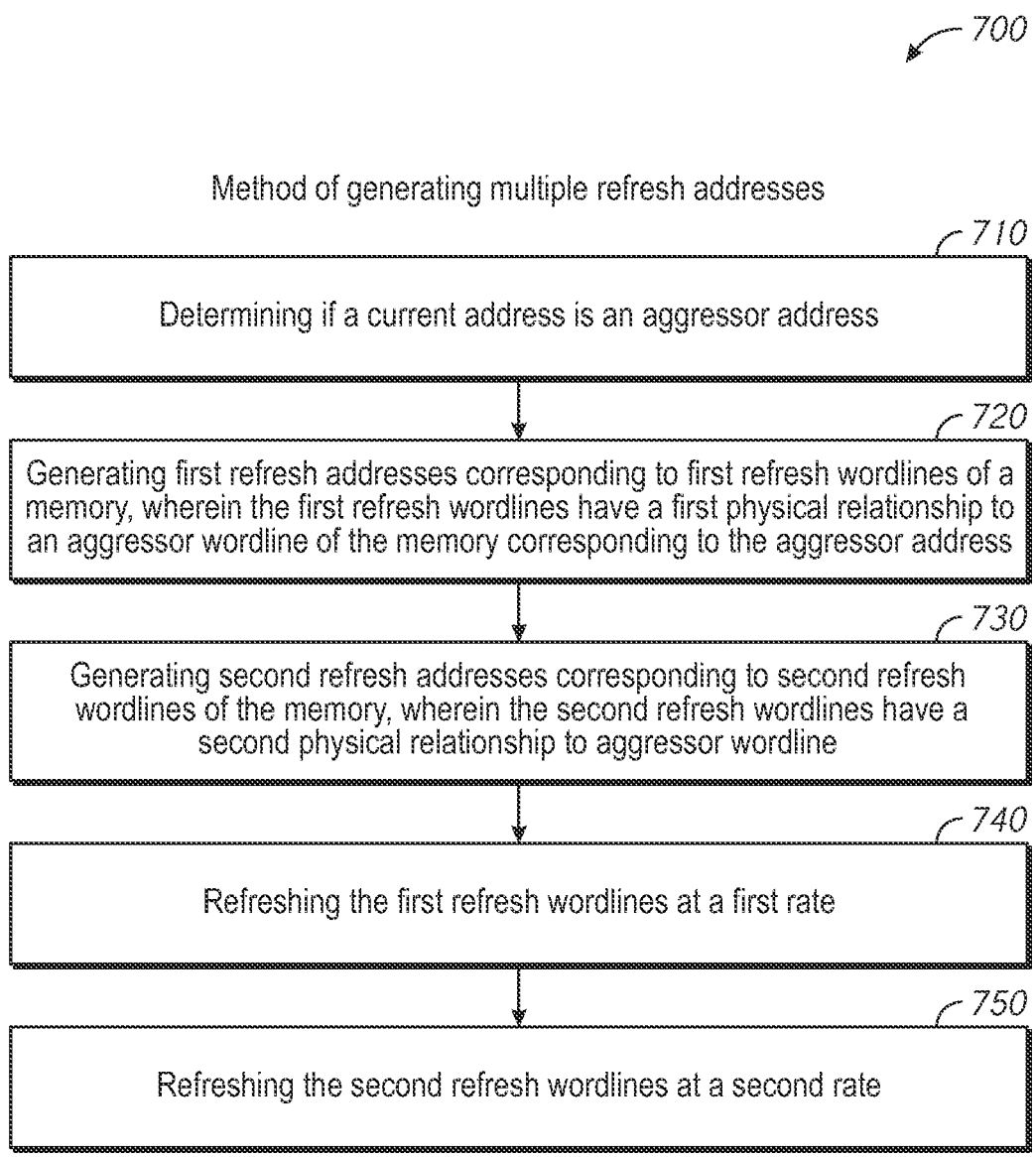
FIG. 7 is a flow chart of a method of generation of multiple refresh addresses based on row hammer address according to an embodiment of the present disclosure.

FIG. 7 is a flow chart showing a method 700 of generating multiple refresh addresses according to an embodiment of the present disclosure. In certain embodiments, the method of FIG. 7, may be implemented by the system 100 of FIG. 1. FIG. 7 includes block 710, which recites "Determining if a current address is an aggressor address, wherein the aggressor address corresponds to an aggressor wordline of a memory". Block 710 is followed by block 720, which recites "Generating a first refresh address corresponding to a first refresh wordline of the memory". Block 720 is followed by block 730, which recites "Generating a second refresh address corresponding to a second refresh wordline of the memory." Block 730 is followed by Block 740 "Refreshing the first refresh wordlines at a first rate." Block 740 is followed by block 750, which recites "Refreshing the second refresh wordlines at a second rate."

Block 710 recites "Determining if a current address is an aggressor address, wherein the aggressor address corresponds to an aggressor wordline of a memory". The current address may be an address which is currently being provided by an address decoder circuit (e.g. address decoder 32 of FIG. 1). The current address may change in time as different commands corresponding to different addresses are input to the circuit. The address may indicate activation (e.g., access) of a particular location in a memory, such as a row or wordline. Certain wordlines may be activated in such a way that they become aggressor wordlines (e.g., a wordline corresponding to a row hammer addresses) and negatively impact the data stored in other memory cells corresponding other addresses. The current address may be tracked over time to determine if the current address is a hammer address. As an example, addresses may be saved and compared against a current address to determine if the current address has recently been provided. Such addresses may be frequently accessed, and may cause degradation of other memory cells.

Block 720 recites "Generating a first refresh address corresponding to a first refresh wordline of the memory". The addresses which are provided by the address decoder circuit may correspond to specific locations within a memory cell array (e.g., memory cell array 11 of FIG. 1). In this example, each address may be a row address which corresponds to wordline (row) of the memory cell. The method 700 may include determining refresh wordlines which are affected by the aggressor row. These affected wordlines may be determined based on a set relationship that the refresh wordlines have with the aggressor wordline. For example, the refresh wordlines may have a set physical relationship, such as a predetermined location, relative to the aggressor wordline. The first refresh wordlines may have a first physical relationship with an aggressor wordline corresponding to the aggressor address. The aggressor address and the refresh address (corresponding to the refresh wordline) do not have to share the same relationship that their respective wordlines share. For example, if the refresh wordlines are adjacent to the aggressor wordline, their respective addresses do not have to be directly adjacent in a sequence of addresses, as long as the relationships between their corresponding wordlines are known. Block 720 may involve calculating the refresh addresses based on a desired relationship between the wordlines.

Block 730 recites "Generating a second refresh address corresponding to a second refresh wordline of the memory." The operation of the block 730 may be generally similar to the operation of the block 720 described herein. However, in block 730 second refresh addresses are generated which have a second physical relationship to the aggressor wordline. The second physical relationship may be a different physical relationship to the aggressor wordline than the first aggressor wordline. For example, the first refresh wordlines may be adjacent to the aggressor wordline, while the second refresh wordlines are non-adjacent to the aggressor wordline.

Block 740 recites "Refreshing the first refresh wordlines at a first rate." The first refresh wordlines may be refreshed at a given rate. The rate at which the first wordlines are refreshed may be based on how much they are expected to be affected by the aggressor address. The first rate may be determined, at least in part, based on an access frequency of the aggressor address. The first rate may be determined, at least in part, based on a rate of a refresh signal. The first rate may be linked to a certain number of activations of the refresh signal.

Block 750 recites "Refreshing the second refresh wordlines at a second rate." The second wordlines may be refreshed at a given second rate, which may be different from the first rate. The second rate may be based, at least in part, on how much the second wordlines are expected to be affected by the aggressor address. In some examples, where the second refresh wordlines are expected to be less affected than the first refresh wordlines, the second rate may be slower than the first rate. In some examples, the second rate may be a subset of the first rate, such as a fraction of the first rate.

The first and second refresh addresses may each be based off of a same aggressor address. The first and second refresh addresses may each be based off of different aggressor addresses if a new aggressor address is identified between generating the first refresh addresses and generating the second refresh addresses. If no aggressor address is detected, then a normal refresh operation may be carried out at a third rate, which may be faster than either the first or second rates. The normal refresh operation may be interrupted to allow for wordlines corresponding to either the first or second refresh addresses to be refreshed.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
   determining when a current address is an aggressor address, wherein the aggressor address corresponds to an aggressor wordline of a memory;
   generating a first refresh address corresponding to a first wordline of the memory, wherein the first wordline has a first physical relationship to the aggressor wordline;
   generating a second refresh address corresponding to a second wordline of the memory, wherein the second wordline has a second physical relationship to the aggressor wordline, wherein the first physical relationship comprises the first wordline being adjacent to the aggressor wordline, and wherein the second physical relationship comprises the second wordline being non-adjacent to the aggressor wordline;
   refreshing the first wordline at a first rate; and
   refreshing the second wordline at a second rate.

2. The method of claim 1, wherein determining when a current address is an aggressor address comprises sampling addresses and comparing the current address to the sampled addresses.

3. The method of claim 2, wherein the sampling addresses occur at random or pseudo-random intervals.

4. The method of claim 1, wherein the second word line is further from the aggressor wordline than the first wordline is.

5. The method of claim 1, further comprising changing the current address to a second address and determining when the second address is a second aggressor address, wherein the first refresh address is generated based on the aggressor address, and the second refresh address is generated based on the second aggressor address.

6. A method comprising:
   determining when a current address is an aggressor address, wherein the aggressor address corresponds to an aggressor wordline of a memory;
   generating a first refresh address corresponding to a first wordline of the memory, wherein the first wordline has a first physical relationship to the current aggressor wordline;
   generating a second refresh address corresponding to a second wordline of the memory, wherein the second wordline has a second physical relationship to the current aggressor wordline;
   refreshing the first wordline at a first rate; and
   refreshing the second wordline at a second rate, wherein determining a current address is an aggressor address comprises sampling addresses and comparing the current address to the sampled addresses, and wherein the sampling addresses occur in response to a signal from an internal oscillator.

7. An apparatus comprising:
   an address hammer detector configured to determine when a current address is an aggressor address, wherein the aggressor address corresponds to an aggressor wordline of a memory;
   a refresh address generator configured to provide a first refresh address corresponding to a first wordline of the memory at a first rate, wherein the first wordline has a first physical relationship to the aggressor wordline, and configured to provide a second refresh address corresponding to a second wordline of the memory at a second rate, wherein the second wordline has a second physical relationship to the aggressor wordline, wherein the first wordline is adjacent to the aggressor wordline, and wherein the second wordline is further from the aggressor wordline than the first wordline; and
   a row decoder configured to refresh the first or the second wordline based on receiving the first or the second refresh address.

8. The apparatus of claim 7, wherein the address hammer detector is configured to sample the current address and determine when the sampled address is the aggressor address.

9. The apparatus of claim 8, wherein the address hammer detector is configured to sample the current address a first time and determine a first aggressor address and sample the current address a second time and determine a second aggressor address, wherein the first refresh address is based on the first aggressor address, and wherein the second refresh address is based on the second aggressor address.

10. The apparatus of claim 7, wherein the refresh address generator is configured to determine the second rate based on the first rate.

11. The apparatus of claim 10, wherein the refresh address generator is configured to determine the second rate based on a selected fraction of the first rate, wherein a command signal is used to select the fraction.

12. An apparatus comprising:
   a command address input circuit configured to provide a current address;
   a refresh control circuit configured to determine when the current address is an aggressor address associated with an aggressor word line and provide a refresh address associated with a refresh wordline based on the aggressor address, wherein the refresh wordline has a first physical relationship with the aggressor address or a second physical relationship with the aggressor address, and wherein the refresh control circuit is configured to provide the refresh address associated with the refresh wordline with the first physical relationship at a first rate and configured to provide the refresh address associated with the refresh wordline with the second physical relationship at a second rate, wherein the refresh wordline with the first physical relationship is adjacent to the aggressor wordline, and wherein the refresh wordline with the second physical relationship is not adjacent to the aggressor wordline; and a row decoder configured to refresh the refresh wordline based on the refresh address.

13. The apparatus of claim 12, wherein the refresh wordline with the second physical relationship is separated from the aggressor wordline by another wordline.

14. The apparatus of claim 12, wherein the refresh control circuit is configured to count a number of times the refresh address is associated with the refresh word line with the first physical relationship and provide the refresh address associated with the refresh wordline with the second physical relationship when the count reaches a value.

15. The apparatus of claim 14, wherein the value is selectable.

16. The apparatus of claim 12, wherein the refresh control circuit is configured to sample the current address.

* * * * *